(12) United States Patent
Cai (10) Patent No.: US 10,332,451 B2
(45) Date of Patent: Jun. 25, 2019

(54) AMOLED PIXEL DRIVER CIRCUIT AND PIXEL DRIVING METHOD

(71) Applicant: Shenzhen China Star Optoelectronics Technology Co., Ltd., Shenzhen (CN)

(72) Inventor: Yuying Cai, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 180 days.

(21) Appl. No.: 15/328,494

(22) PCT Filed: Dec. 16, 2016

(86) PCT No.: PCT/CN2016/110250
§ 371 (c)(1),
(2) Date: Jan. 24, 2017

(87) PCT Pub. No.: WO2018/045660
PCT Pub. Date: Mar. 15, 2018

(65) Prior Publication Data
US 2018/0218681 A1    Aug. 2, 2018

(30) Foreign Application Priority Data
Sep. 9, 2016   (CN) .......................... 2016 1 0816226

(51) Int. Cl.
*G09G 3/3258*    (2016.01)
*G09G 3/3266*    (2016.01)
(Continued)

(52) U.S. Cl.
CPC ......... *G09G 3/3258* (2013.01); *G09G 3/3233* (2013.01); *G09G 3/3266* (2013.01);
(Continued)

(58) Field of Classification Search
CPC .. G09G 3/3258; G09G 3/3275; G09G 3/3266; G09G 3/3233; G09G 2300/0852;
(Continued)

(56) References Cited

U.S. PATENT DOCUMENTS

2015/0379934 A1* 12/2015 Xiaoling .............. G09G 3/3233
345/214

FOREIGN PATENT DOCUMENTS

CN    102005182 A    4/2011
CN    103700347 A    4/2014

* cited by examiner

*Primary Examiner* — Abhishek Sarma
(74) *Attorney, Agent, or Firm* — Leong C. Lei (57) ABSTRACT

The invention discloses an AMOLED pixel driver circuit and pixel driving method, by using a pixel driver circuit of 4T1C or 4T2C structure to effectively compensate threshold voltage of driving TFT in each pixel; through adding a third TFT (T3) and a fourth TFT (T4) and introducing the first scan signal (SEL1) to control the third TFT (T3) and the fourth TFT (T4) to respectively writing the initialization signal (INI) to initialize the gate and the source of the driving TFT in reset phase so as to reduce the complexity of the power supply signal so that the circuit can use DC power supply directly; by adding a second capacitor (C2) to regulate the influence on the source voltage of the driving TFT by the data signal (DATA) so as to reduce the data signal complexity. As a result, the data signal only needs to switch once.

4 Claims, 11 Drawing Sheets

(51) Int. Cl.
*G09G 3/3275* (2016.01)
*H01L 27/32* (2006.01)
*G09G 3/3233* (2016.01)

(52) U.S. Cl.
CPC ....... *G09G 3/3275* (2013.01); *H01L 27/3262* (2013.01); *H01L 27/3265* (2013.01); *H01L 27/3276* (2013.01); *G09G 2300/0819* (2013.01); *G09G 2300/0842* (2013.01); *G09G 2300/0852* (2013.01)

(58) Field of Classification Search
CPC .... G09G 2300/0842; G09G 2300/0819; H01L 27/3262; H01L 27/3265; H01L 27/3276
See application file for complete search history.

AMOLED PIXEL DRIVER CIRCUIT AND PIXEL DRIVING METHOD

BACKGROUND OF THE INVENTION

1. Field of the Invention

The present invention relates to the field of display techniques, and in particular to an AMOLED pixel driver and pixel driving method.

2. The Related Arts

The organic light emitting diode (OLED) display provides the advantages of active light-emitting, low driving voltage, high emission efficiency, quick response time, high resolution and contrast, near 180° viewing angle, wide operation temperature range, and capability to realize flexible display and large-area full-color display, and is regarded as the most promising display technology.

The driving types of OLED can be divided, according to the driving method, into the passive matrix OLED (PMOLED) and active matrix OLED (AMOLED), i.e., the direct addressable type and thin film transistor (TFT) addressable type, wherein the AMOLED provides the advantages of pixels arranged in an array, self-luminous, and high luminous efficiency and is commonly used for high definition large-size display.

AMOLED is a current-driven device that emits light when a current flows through the OLED, and the light-emitting luminance is determined by the current flowing through the OLED. Most of the known integrated circuits (ICs) only transmit voltage signals, so the AMOLED pixel driver circuit needs to complete the task of converting the voltage signal into a current signal. The known AMOLED pixel driver circuit is usually 2T1C structure, that is, two thin film transistors (TFTs) and a capacitor, to convert voltage to current, but the traditional 2T1C pixel driver circuit generally does not provide a compensation function.

Figure 1:
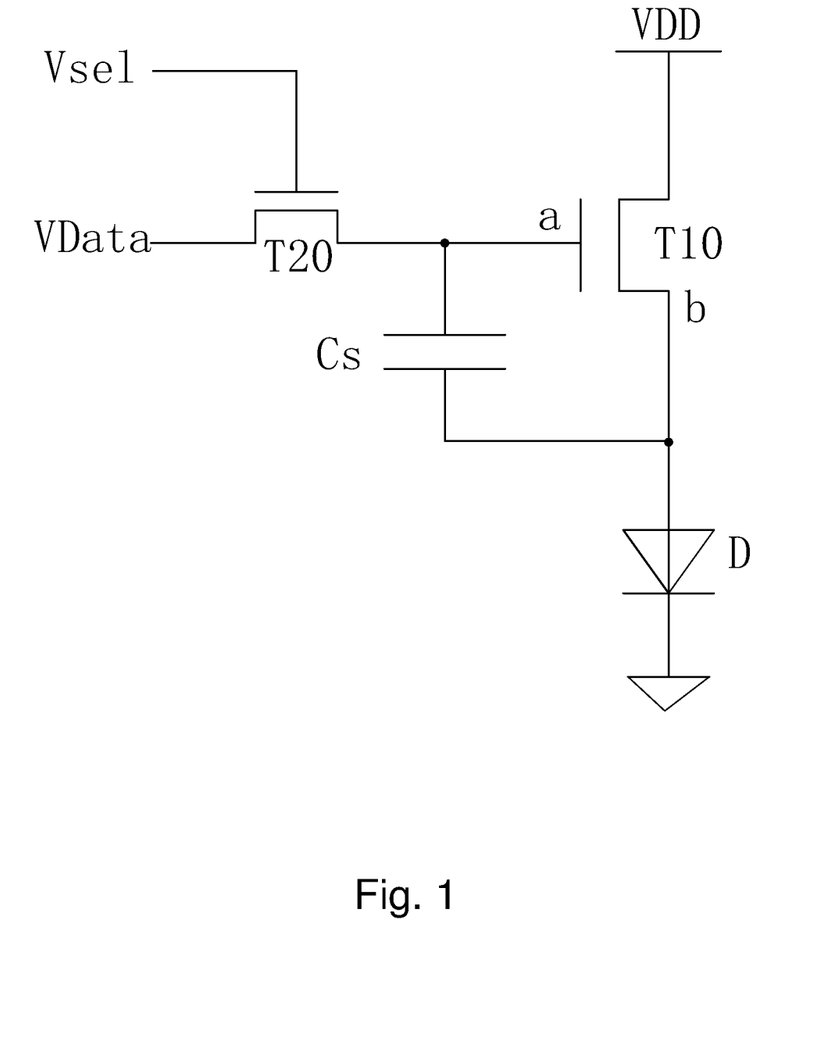
FIG. 1 is a schematic view showing a known 2T1C pixel driver circuit for AMOLED.

As shown in FIG. 1, a known 2T1C pixel driver circuit for AMOLED with a compensation function comprises a first TFT T10, a second TFT T20, and a capacitor Cs, wherein the first TFT T10 is a driving TFT, the second TFT T20 is a switching TFT, and the capacitor Cs is a storage capacitor. Specifically, the gate of the second TFT T20 is electrically connected to the first scan signal Vsel, the source connected to the data signal voltage VData, and the drain connected to the gate of the first TFT T10 and one end of the capacitor Cs; the drain of the first TFT T10 is electrically connected to the alternating current power supply VDD, the source connected to the anode of the OLED D; the cathode of the OLED D is electrically connected to the ground; one end of the capacitor Cs is electrically connected to the drain of the second TFT T20, and the other end connected to the source of the first TFT T10.

Figure 2:
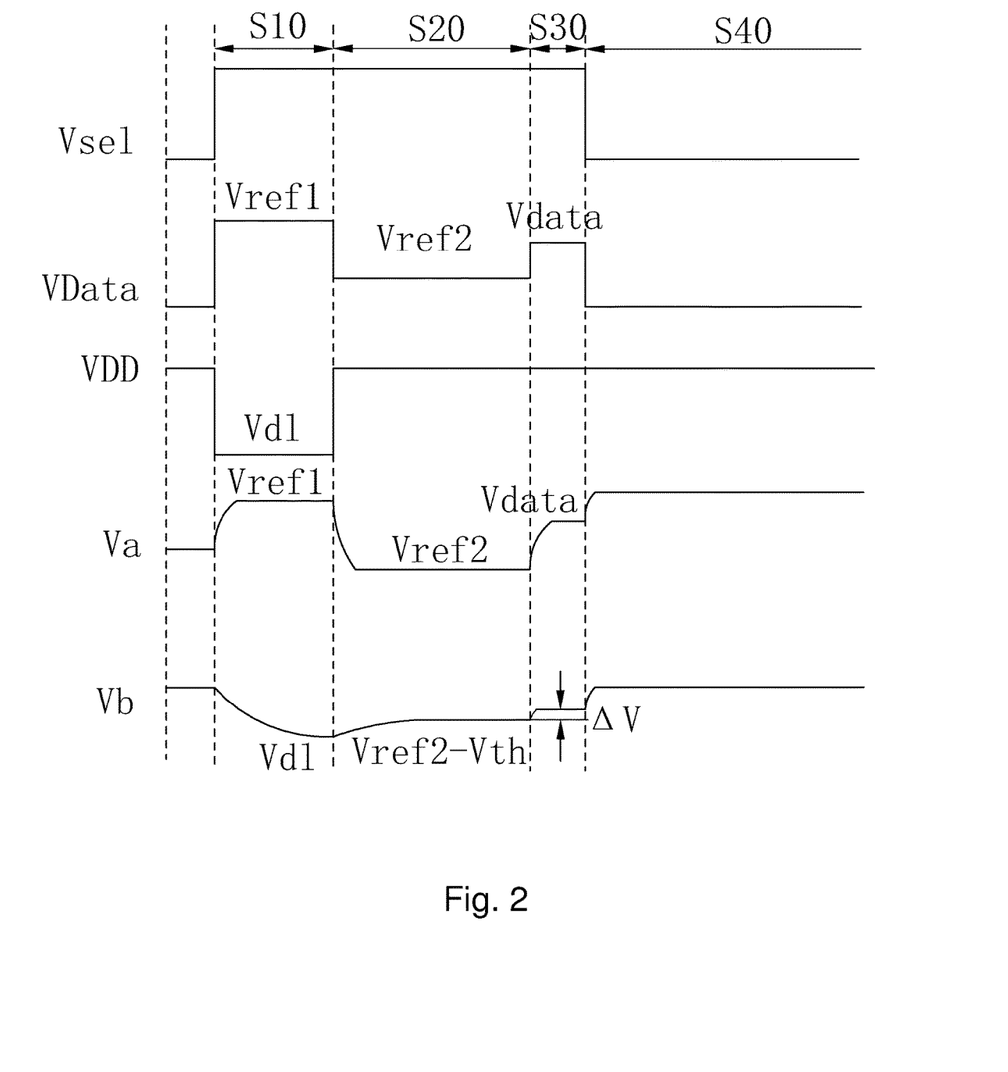
FIG. 2 is a schematic view showing the operation phases of the circuit in FIG. 1 and the waveform of corresponding key nodes.

Referring to FIG. 2, FIG. 2 is a schematic view showing the operation phases of the circuit in FIG. 1 and the waveform of corresponding key nodes. As shown in FIG. 2, the 2T1C pixel driver circuit in FIG. 1 is divided into four operation phases, as follows:

1. Reset phase S10: The first scan signal Vsel provides a high level voltage to turn on the second TFT T20, and the data signal voltage VData supplies a first reference voltage Vref1 to the gate of the first TFT T10 via the second TFT T20, i.e., the gate voltage Va=Vref1 of the first TFT T10, the first TFT T10 is turned on, and the alternating current power supply VDD supplies a low level voltage Vdl, and the source voltage Vb=Vdl of the first TFT T10.

2. Threshold voltage detection phase S20: The first scan signal Vsel provides a high level voltage to turn on the second TFT T20, and the data signal voltage VData supplies provide a second reference voltage Vref2 to the gate of the first TFT T10 via the second TFT T20, and Vref2<Vref1, i.e., the gate voltage Va=Vref2 of the first TFT T10, the first TFT T10 is turned on, the alternating current power supply VDD supplies a high level voltage, and the source voltage Vb of the first TFT is raised to Vb=Vref2−Vth, wherein Vth is the threshold voltage of the first TFT T10.

3. Threshold voltage compensation phase S30: The first scan signal Vsel provides a high level voltage to turn on the second TFT T20, and the data signal voltage VData supplies a display data high level voltage Vdata to the gate of the first TFT T10 and the capacitor Cs ovia the second TFT 20, i.e., the gate voltage Va=Vdata of the first TFT T10, the first TFT T10 is turned on, the alternating current power supply VDD supplies a high level voltage, the source voltage Vb of the first TFT T10 is changed to Vb=Vref2−Vth+ΔV, wherein ΔV is an influence on the source voltage of the first TFT T10 caused by the display data signal high level voltage Vdata.

4. Light-emitting phase S40: the first scan signal Vsel provides a low level voltage to turn off the second TFT T20. Due to the storage of the capacitor Cs, the voltage difference between the gate and the source of the first TFT T10 remains unchanged, so that the gate-to-source voltage of the first TFT T10 Vgs=Va−Vb=Vdata−Vref2+Vth−ΔV, able to compensate the threshold voltage of the driving TFT.

However, as the 2T1C pixel driver circuit shown in FIG. 1, the disadvantages of complex signals of alternating current power supply VDD, complex signals of data signal voltage VData, and the necessity of multiple switching remain issues needed to be addressed.

SUMMARY OF THE INVENTION

The object of the present invention is to provide an AMOLED pixel driver circuit, able to effectively compensate the threshold voltage change of the driving TFT, reduce the complexity of the power supply signal and the data signal, and reduce the switching frequency of the data signal.

Another object of the present invention is to provide an AMOLED pixel driving method, able to effectively compensate the threshold voltage change of the driving TFT, and reduce the complexity of the power supply signal and the data signal.

To achieve the above object, the present invention provides an AMOLED driver circuit, which comprises: a first thin film transistor (TFT), a second TFT, a third TFT, a fourth TFT, a first capacitor, and an organic light-emitting diode (OLED);

the first TFT having the gate connected to a first node, the source connected to a second node and the drain connected to the positive terminal of a direct current (DC) power supply;

the second TFT having the gate connected to a second scan signal, the source connected to a data signal and the drain connected to the first node;

the third TFT having the gate connected to a first scan signal, the source connected to an initialization signal and the drain connected to the first node;

the fourth TFT having the gate connected to the first scan signal, the source connected to the initialization signal and the drain connected to the second node;

the first capacitor having one end connected to the first node and the other end connected to the second node;

the OLED having the anode connected to the second node and the cathode connected to the negative terminal of the DC power supply;

the initialization signal being a constant low level, and the data signal being a high level pulse.

According to a preferred embodiment of the present invention, the AMOLED pixel driver circuit further comprises a second capacitor, with one end connected to the drain of the first TFT and the positive terminal of the DC power supply, and the other end connected to the source of the first TFT and the second node.

According to a preferred embodiment of the present invention, the first TFT, the second TFT, the third TFT and the fourth TFT are all low temperature polysilicon (LTPS) TFTs, oxide semiconductor TFTs or amorphous silicon (a-Si) TFTs.

According to a preferred embodiment of the present invention, the first scan signal, the second scan signal, the initialization signal and the data signal are all generated by an external timing controller.

According to a preferred embodiment of the present invention, the first scan signal, the second scan signal and the data signal are combined to correspond in series to a reset phase, a threshold voltage detection phase, a threshold voltage compensation phase and a light-emitting phase;

in the reset phase, the first scan signal is high level, the second scan signal is low level, and the data signal is a reference low level;

in the threshold voltage detection phase, the first scan signal is low level, the second scan signal is high level, and the data signal is the reference low level;

in the threshold voltage compensation phase, the first scan signal is low level, the second scan signal is high level, and the data signal is a display data signal high level;

in the light-emitting phase, the first scan signal is low level, the second scan signal is low level, and the data signal is the reference low level.

Another embodiment of the present invention provides an AMOLED pixel driving method, which comprises:

Step 1: providing an AMOLED pixel driver circuit, comprising: a first thin film transistor (TFT), a second TFT, a third TFT, a fourth TFT, a first capacitor, and an organic light-emitting diode (OLED);

the first TFT having the gate connected to a first node, the source connected to a second node and the drain connected to the positive terminal of a direct current (DC) power supply;

the second TFT having the gate connected to a second scan signal, the source connected to a data signal and the drain connected to the first node;

the third TFT having the gate connected to a first scan signal, the source connected to an initialization signal and the drain connected to the first node;

the fourth TFT having the gate connected to the first scan signal, the source connected to the initialization signal and the drain connected to the second node;

the first capacitor having one end connected to the first node and the other end connected to the second node;

the OLED having the anode connected to the second node and the cathode connected to the negative terminal of the DC power supply;

the initialization signal being a constant low level, and the data signal being a high level pulse;

Step 2: entering reset phase:

the first scan signal providing high level, the second scan signal providing low level, the data signal providing a reference low level Vref, the second TFT cut off, the third TFT and the fourth TFT turned on, an initialization signal being written into the first node (i.e., the gate of the first TFT), an initialization signal being written into the second node (i.e., the source of the first TFT), and the first TFT cut off;

Step 3: entering threshold voltage detection phase, the first scan signal transiting to low level, the second scan signal transiting to high level, and the data signal remaining the reference low level, the third TFT and the fourth TFT cut off, the second TFT turned on, the reference low level of the data signal being written into the first node (i.e., the gate of the first TFT), the second node (i.e., the source of the first TFT) changed to Vref−Vth, wherein Vth being threshold voltage of the first TFT;

Step 4: entering threshold voltage compensation phase, the first scan signal first remaining low level, the second scan signal remaining high level, the data signal transiting to a display data signal high level, the third TFT and the fourth TFT cut off, the second TFT turned on, the data signal writing the display data signal high level via the second TFT into the first node (i.e., the gate of the first TFT) and the first capacitor, the second node (i.e., the source of the first TFT) transiting to Vref−Vth+ΔV, wherein ΔV being influence on the source voltage of the first TFT (i.e., the second node) caused by the display data signal high level voltage;

Step 5: entering light-emitting phase, the first scan signal remaining low level, the second scan signal transiting to low level, and the data signal voltage transiting to low level, the second TFT cut off, the second, third and fourth TFTs cut off, voltage difference between the first node (i.e., the gate of the first TFT) and the second node (i.e., the source of the first TFT) remaining unchanged due to storage effect of the first capacitor;

the OLED emitting light and current flowing through the OLED independent of the threshold voltage of the first TFT.

According to a preferred embodiment of the present invention, the AMOLED pixel driver circuit provided in Step 1 further comprises a second capacitor, with one end connected to the drain of the first TFT and the positive terminal of the DC power supply, and the other end connected to the source of the first TFT and the second node.

According to a preferred embodiment of the present invention, if the AMOLED pixel driver circuit provided in Step 1 does not comprise a second capacitor, the influence on the source voltage ΔV of the first TFT (i.e., the second node) caused by the display data signal high level voltage is:

$$\Delta V=(V\text{data}-V\text{ref})\times(C1/(C1+C_{OLED}))$$

wherein $C_{OLED}$ is the intrinsic capacitance of the OLED.

According to a preferred embodiment of the present invention, if the AMOLED pixel driver circuit provided in Step 1 comprises a second capacitor, the influence on the source voltage ΔV of the first TFT (i.e., the second node) caused by the display data signal high level voltage is:

$$\Delta V=(V\text{data}-V\text{ref})\times(C1/(C1+C2+C_{OLED}))$$

wherein $C_{OLED}$ is the intrinsic capacitance of the OLED.

According to a preferred embodiment of the present invention, the first TFT, the second TFT, the third TFT and the fourth TFT are all low temperature polysilicon (LTPS) TFTs, oxide semiconductor TFTs or amorphous silicon (a-Si) TFTs; the first scan signal, the second scan signal, the initialization signal and the data signal are all generated by an external timing controller.

Yet another embodiment of the present invention provides an AMOLED driver circuit, which comprises: a first thin film transistor (TFT), a second TFT, a third TFT, a fourth TFT, a first capacitor, and an organic light-emitting diode (OLED);

the first TFT having the gate connected to a first node, the source connected to a second node and the drain connected to the positive terminal of a direct current (DC) power supply;

the second TFT having the gate connected to a second scan signal, the source connected to a data signal and the drain connected to the first node;

the third TFT having the gate connected to a first scan signal, the source connected to an initialization signal and the drain connected to the first node;

the fourth TFT having the gate connected to the first scan signal, the source connected to the initialization signal and the drain connected to the second node;

the first capacitor having one end connected to the first node and the other end connected to the second node;

the OLED having the anode connected to the second node and the cathode connected to the negative terminal of the DC power supply;

the initialization signal being a constant low level, and the data signal being a high level pulse;

the AMOLED pixel driver circuit further comprising a second capacitor, with one end connected to the drain of the first TFT and the positive terminal of the DC power supply, and the other end connected to the source of the first TFT and the second node;

wherein the first TFT, the second TFT, the third TFT and the fourth TFT are all low temperature polysilicon (LTPS) TFTs, oxide semiconductor TFTs or amorphous silicon (a-Si) TFTs.

Compared to the known techniques, the present invention provides the following advantages. The present invention provides an AMOLED pixel driver circuit and pixel driving method, by using a pixel driver circuit of 4T1C or 4T2C structure to effectively compensate threshold voltage of driving TFT in each pixel; through adding a third TFT and a fourth TFT and introducing the first scan signal to control the third TFT and the fourth TFT to respectively writing the initialization signal to initialize the gate and the source of the driving TFT in reset phase so as to reduce the complexity of the power supply signal so that the circuit can use DC power supply directly; by adding a second capacitor to regulate the influence on the source voltage of the driving TFT by the data signal voltage so as to reduce the data signal complexity. As a result, the data signal only needs to switch once.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 3:
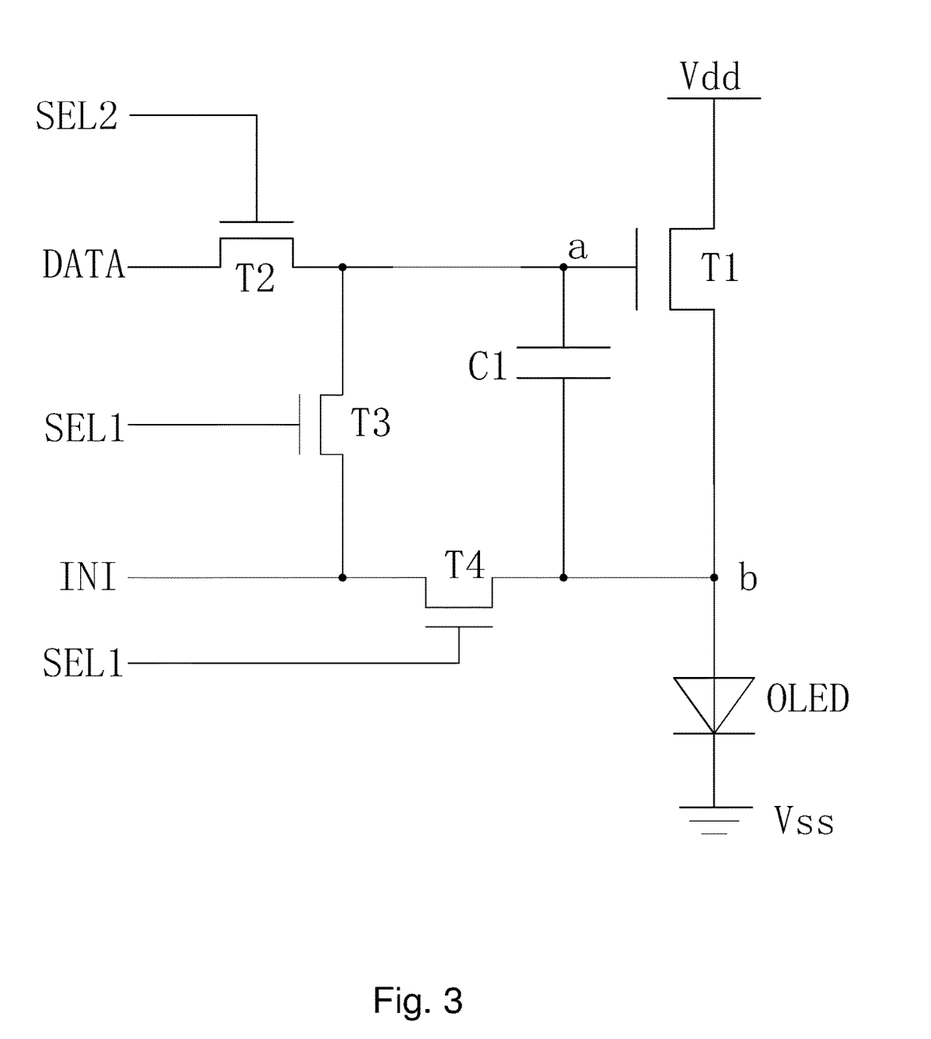
FIG. 3 is a schematic view showing a pixel driver circuit for AMOLED provided by the first embodiment of the present invention.

Referring to FIG. 3, the present invention provides an AMOLED pixel driver circuit, which comprises: a first thin film transistor (TFT) T1, a second TFT T2, a third TFT T3, a fourth TFT T4, a first capacitor C1, and an organic light-emitting diode (OLED) OLED.

The first TFT T1 has the gate connected to a first node a, the source connected to a second node b and the drain connected to the positive terminal Vdd of a DC power supply.

The second TFT T2 has the gate connected to a second scan signal SEL2, the source connected to a data signal DATA and the drain connected to the first node a.

The third TFT T3 has the gate connected to a first scan signal SEL1, the source connected to tan initialization signal INI, and the drain connected to the first node a.

The fourth TFT T4 has the gate connected to a first scan signal SEL1, the source connected to tan initialization signal INI, and the drain connected to the second node b.

The first capacitor C1 has one end connected to the first node a and the other end connected to the second node b.

The OLED OLED has the anode connected to the second node b and the cathode connected to the negative terminal Vss of the DC power supply.

The first TFT T1 is the driving TFT.

Specifically, the first TFT T1, the second TFT T2, the third TFT T3, and the fourth TFT are all low temperature polysilicon (LTPS) TFTs, oxide semiconductor TFTs or amorphous silicon (a-Si) TFTs.

Specifically, the first scan signal SEL1, the second scan signal SEL2, the initialization signal INI and the data signal DATA are all generated by an external timing controller.

Figure 4:
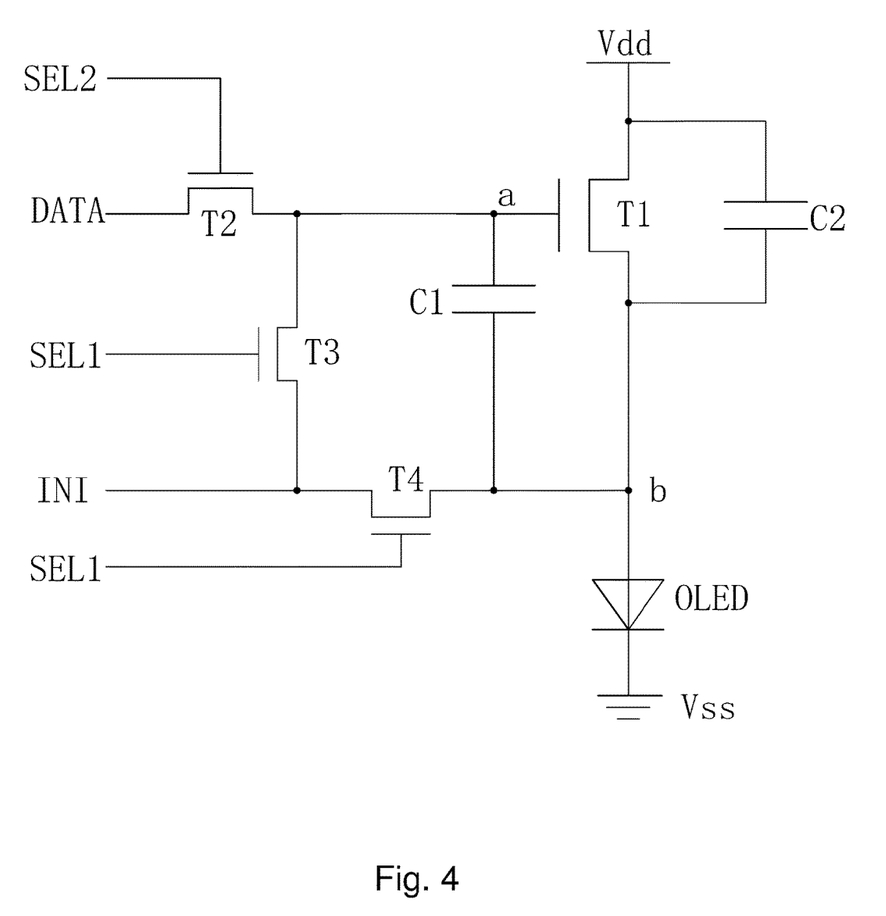
FIG. 4 is a schematic view showing a pixel driver circuit for AMOLED provided by the second embodiment of the present invention.
Figure 5:
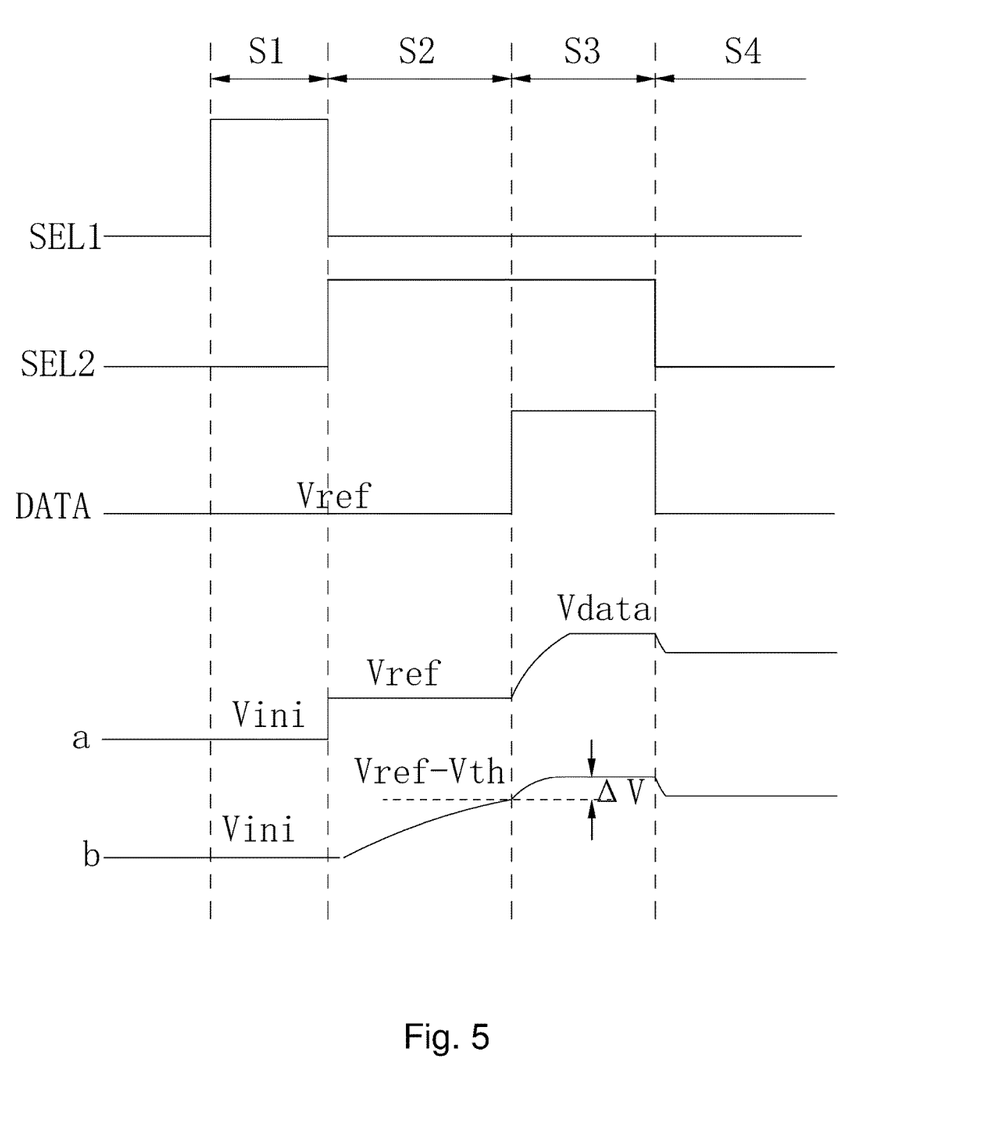
FIG. 5 is a schematic view showing the operation phases of the circuit provided by an embodiment of the present invention and the waveform of corresponding key nodes.

In addition, referring to FIGS. 3-5, the initialization signal INI is a constant low level voltage, and the data signal DATA is a high level single pulse. The first scan signal SEL1, the second scan signal SEL2 and the data signal voltage DATA are combined to correspond, in series, to a reset phase S1, a threshold voltage detection phase S2, a threshold voltage compensation phase S3 and a light-emitting phase S4.

In the reset phase S1, the first scan signal SEL1 is high level, the second scan signal SEL2 is low level, and the data signal DATA is a reference low level Vref.

In the threshold voltage detection phase S2, the first scan signal SEL1 is low level, the second scan signal SEL2 is high level, and the data signal DATA is the reference low level Vref.

In the threshold voltage compensation phase S3, the first scan signal SEL1 is low level, the second scan signal SEL2 is high level, and the data signal DATA is a display data signal high level Vdata.

In the light-emitting phase S4, the first scan signal SEL1 is low level, the second scan signal SEL2 is low level, and the data signal DATA is the reference low level Vref.

Wherein the scan signal SEL1 is used to turn on and off the third TFT T3 and the fourth TFT T4 so as to write the constant low level initialization signal INI into the first node a (i.e., the gate of the first TFT T1) and the second node b (i.e., the source of the first TFT T1) in the reset phase S1 to execute initialization, erase residual data so that the circuit can directly use the DC power supply to achieve complexity reduction of the power supply signal. The first capacitor C1 is for storage; the second scan signal SEL2 is used to turn on and off the second TFT T2 and the data signal DATA writes via the second TFT T2 into the first node a (i.e., the gate of the first TFT T1).

It should be noted that, in threshold voltage compensation phase S3, the data signal DATA transits from the reference low level Vref to the display data high level Vdata, and cause the influence the source voltage ΔV of the first TFT (i.e., the second node). For the first embodiment:

$$\Delta V = (V\text{data} - V\text{ref}) \times (C1/(C1 + C_{OLED})),$$

wherein $C_{OLED}$ is the intrinsic capacitance of the OLED.

FIG. 4 shows the second embodiment of the AMOLED pixel driver circuit of the present invention. Compared to the first embodiment, the AMOLED pixel driver circuit further comprises a second capacitor C2, with one end connected to the drain of the first TFT T1 and the positive terminal Vdd of the DC power supply, and the other end connected to the source of the first TFT T1 and the second node b. The remaining structure is the same as the first embodiment, and the detailed descriptions will not be repeated here. Furthermore, the second capacitor C2 can be formed by stacking the anode of the OLED OLED and the positive terminal Vdd of the DC power supply, and will not reduce the pixel aperture ratio.

It should be noted that, in threshold voltage compensation phase S3, the data signal DATA transits from the reference low level Vref to the display data high level Vdata, and cause the influence the source voltage ΔV of the first TFT (i.e., the second node). For the second embodiment:

$$\Delta V = (V\text{data} - V\text{ref}) \times (C1/(C1 + C2 + C_{OLED})),$$

wherein $C_{OLED}$ is the intrinsic capacitance of the OLED.

As shown, the second capacitor C2 can regulate the influence on the source voltage of the driving TFT caused by the data signal DATA so as to reduce the complexity of data signal and the data signal only needs to switch once.

Referring to FIGS. 6-9, in combination with FIGS. 3, 5 or FIGS. 4-5, and based on the AMOLED pixel driver circuit, the present invention also provides an AMOLED pixel driving method, which comprises the following steps:

Step 1: providing an AMOLED pixel driver circuit of 4T1C structure as shown in FIG. 3 or 4T2C structure in FIG. 4. The details of the circuit will not be repeated here.

Figure 6:
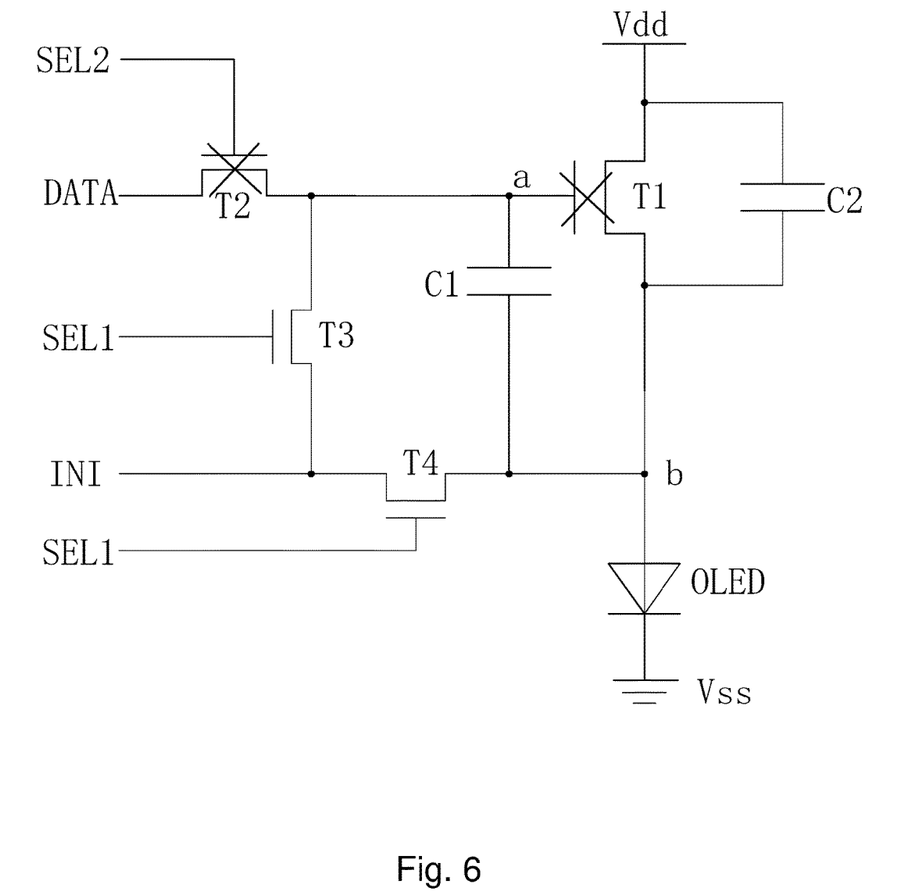
FIG. 6 is a schematic view showing Step 2 of the pixel driving method provided by an embodiment of the present invention.

Step 2: referring to FIG. 6, in combination with FIGS. 4-5, entering the reset phase S1.

The first scan signal SEL1 provides high level, the second scan signal SEL2 provides low level, the data signal DATA provides a reference low level Vref, the second TFT T2 is cut off, the third TFT T3 and the fourth TFT T4 are turned on; the constant low level initialization signal INI is written via the third TFT T3 into the first node a (i.e., the gate of the first TFT T1) and via the fourth TFT T4 into the second node b (i.e., the source of the first TFT T1) so as to initialize the gate and source of the first TFT t1 and erase residual data; the first TFT T1 is cut off.

In the reset phase S1:

$$Vg = Va = Vini$$

$$Vs = Vb = Vini$$

Wherein Vg is the gate voltage of the first TFT T1, Va is the voltage of the first node a, Vs is the source voltage of the first TFT T1, and Vb is the voltage of the second node b.

At this phase, the OLED OLED does not emit light.

Figure 7:
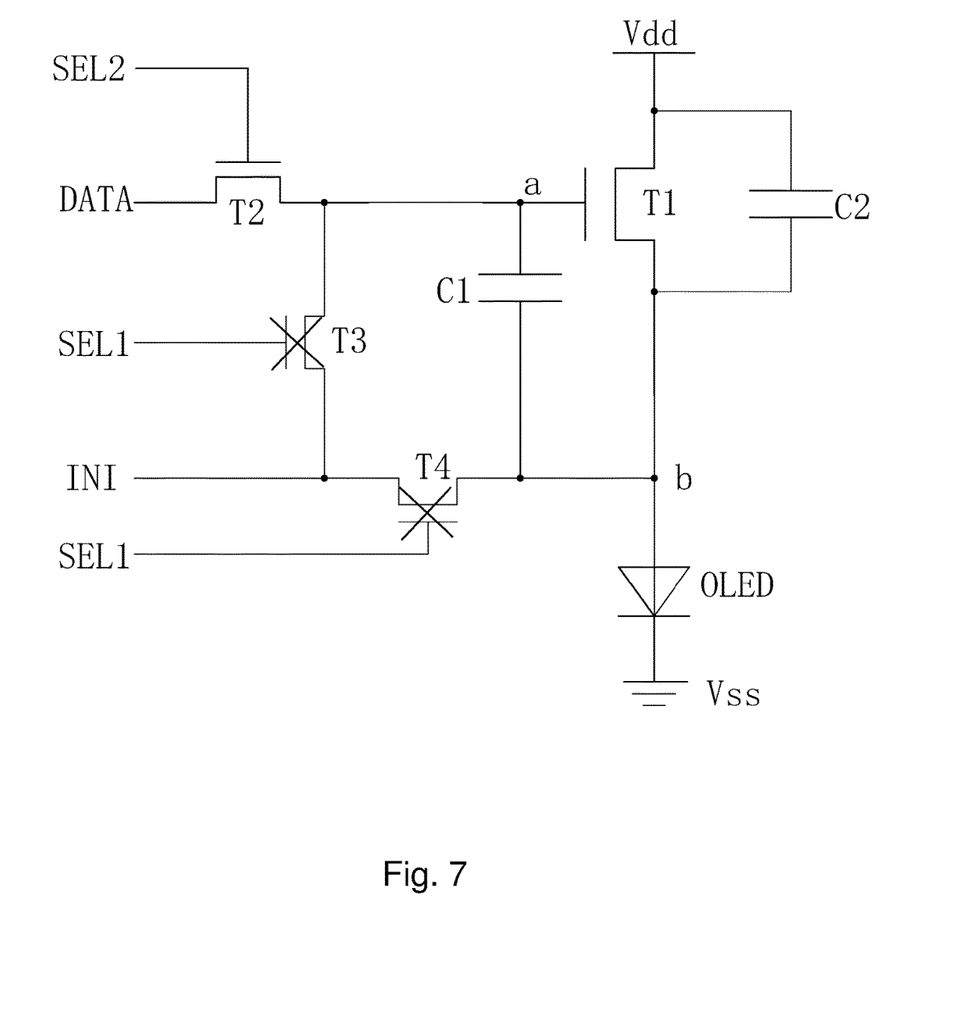
FIG. 7 is a schematic view showing Step 3 of the pixel driving method provided by an embodiment of the present invention.

Step 3: referring to FIG. 7, in combination with FIGS. 4-5, entering threshold voltage detection phase S2.

The first scan signal SEL1 transits to low level, the second scan signal SEL2 transits to high level, the data signal DATA remains the reference low level Vref, the third TFT T3 and the fourth TFT T4 are cut off, the second TFT T2 is turned on, the reference low level Vref of the data signal DATA is written into the first node a (i.e., the gate of the first TFT T1), the second node b (i.e., the source of the first TFT T1) is changed to Vref−Vth, wherein Vth is threshold voltage of the first TFT T1.

In the threshold voltage detection phase S2:

$$Vg = Va = V\text{ref}$$

$$Vs = Vb = V\text{ref} - Vth$$

Figure 8:
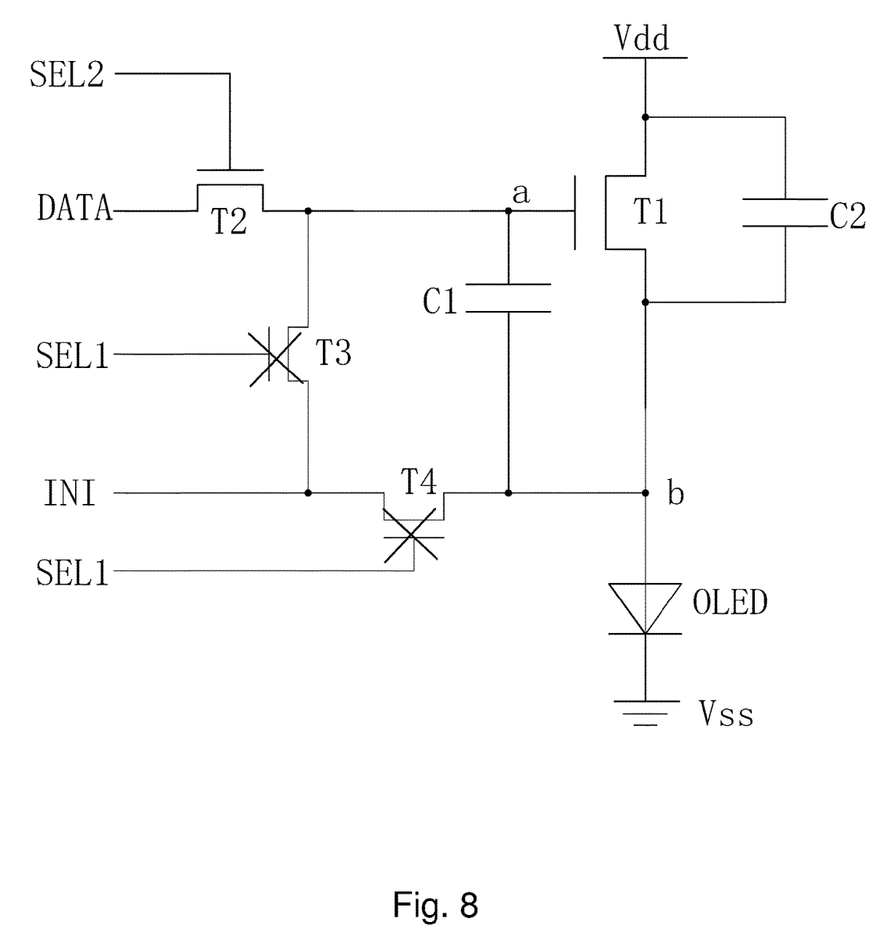
FIG. 8 is a schematic view showing Step 4 of the pixel driving method provided by an embodiment of the present invention.

Step 4: referring to FIG. 8, in combination with FIGS. 4-5, entering threshold voltage compensation phase S3.

The first scan signal SEL1 remains high level, the second scan signal SEL2 remains high level, and the data signal DATA provides a display data signal high level Vdata, the third TFT T3 and the fourth TFT T4 are cut off, the second TFT T2 is turned on, the data signal DATA writes the display data signal high level Vdata via the second TFT T2 into the first node a (i.e., the gate of the first TFT T1) and the first capacitor C1, the second node b (i.e., the source of the first TFT T1) transits to Vref−Vth+ΔV, wherein ΔV is the influence on the source voltage of the first TFT T1 (i.e., the second node b) caused by the display data signal high level voltage Vdata.

In the threshold voltage compensation phase S3:

$$Vg = Va = V\text{data}$$

$$Vs = Vb = V\text{ref} - Vth + \Delta V$$

Then, the voltage difference Vgs between the gate voltage Vg and source voltage Vs of the first TFT T1 is:

$$Vgs = Vg - Vs = V\text{data} - V\text{ref} + Vth - \Delta V$$

For the AMOLED pixel driver circuit of 4T1C structure in FIG. 3, in the threshold voltage compensation phase S3:

$$\Delta V = (V\text{data} - V\text{ref}) \times (C1/(C1 + C_{OLED})),$$

wherein $C_{OLED}$ is the intrinsic capacitance of the OLED OLD;

$$Vgs = Vdata - Vref + Vth - \Delta V \quad (1)$$
$$= Vdata - Vref + Vth - (Vdata - Vref) \times (C1/(C1 + C_{OLED}))$$
$$= (Vdata - Vref) \times (1 - C1/(C1 + C_{OLED})) + Vth$$

For the AMOLED pixel driver circuit of 4T2C structure in FIG. 4, in the threshold voltage compensation phase S3:

$$\Delta V = (Vdata - Vref) \times (C1/(C1+C2+C_{OLED})),$$

wherein $C_{OLED}$ is the intrinsic capacitance of the OLED OLD;

$$Vgs = Vdata - Vref + Vth - \Delta V \quad (2)$$
$$= Vdata - Vref + Vth - (Vdata - Vref) \times \left(\frac{C1}{(C1+C2+C_{OLED})}\right)$$
$$= (Vdata - Vref) \times (1 - C1/(C1+C2+C_{OLED})) + Vth$$

Figure 9:
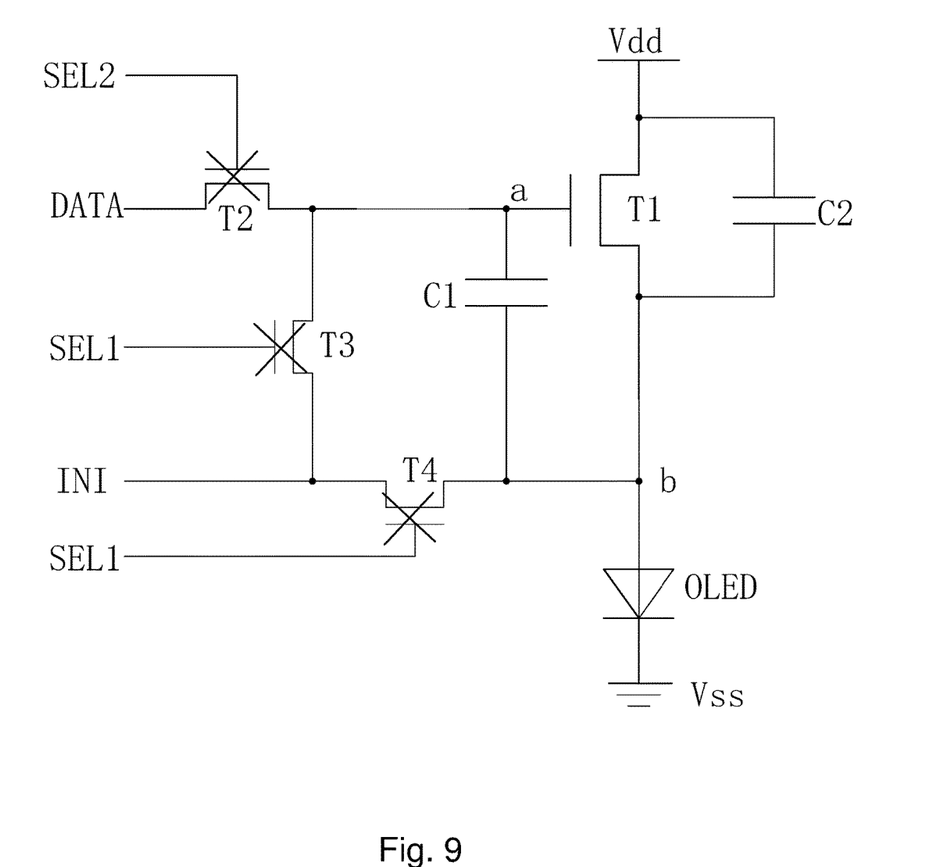
FIG. 9 is a schematic view showing Step 5 of the pixel driving method provided by an embodiment of the present invention.

Step 5: referring to FIG. 9, in combination with FIGS. 4-5, entering light-emitting phase S4.

The first scan signal SEL1 remains low level, the second scan signal SEL2 transits to low level, the data signal DATA transits to the reference low level Vref, the second TFT T2, the third TFT T3 and the fourth TFT T4 are all cut off, the voltage difference Vgs between the first node a (i.e., the gate of the first TFT T1) and the second node b (i.e., the source of the first TFT T1) remains unchanged due to storage effect of the first capacitor C1.

Furthermore, the equation to compute the current flowing through the OLED OLED is:

$$I_{OLED} = \frac{1}{2}Cox(\mu W/L)(Vgs - Vth)^2 \quad (3)$$

Wherein $I_{OLED}$ is the current flowing through the OLED OLED, $\mu$ is the carrier migration rate of the driving TFT, W and L are the width and length of channel of the driving TFT, Vgs is the voltage difference between the gate and the source of the driving TFT, and Vth is the threshold voltage of the driving TFT. In the present invention, the threshold voltage Vth of the driving TFT is the threshold voltage Vth of the first TFT T1.

For the AMOLED pixel driver circuit of 4T1C structure in FIG. 3, substitute (1) into equation (3):

$$I_{OLED} = \frac{1}{2}Cox(\mu W/L)((Vdata - Vref) \times (1 - C1/(C1 + C_{OLED})))^2$$

For the AMOLED pixel driver circuit of 4T2C structure in FIG. 4, substitute (1) into equation (3):

$$I_{OLED} = \frac{1}{2}Cox(\mu W/L)((Vdata - Vref) \times (1 - C1/(C1+C2+C_{OLED})))^2$$

As shown, the current $I_{OLED}$ flowing through the OLED OLED is independent of the threshold voltage of the first TFT T1, which achieves compensation. When the OLED OLED emits light, the current $I_{OLED}$ flowing through the OLED OLED is independent of the threshold voltage of the first TFT T1.

In the pixel driving method of the present invention, the constant low level initialization signal INI is written into the first node a (i.e., the gate of the first TFT T1) and the second node b (i.e., the source of the first TFT T1) in the reset phase S1 to execute initialization, erase residual data so that the circuit can directly use the DC power supply to achieve complexity reduction of the power supply signal. The second capacitor C2 can regulate the influence on the source voltage of the driving TFT caused by the data signal DATA, so that the data signal DATA only needs to switch between the reference low level Vref and the display data signal high level Vdata in the form of high level single pulse, so as to reduce the complexity of data signal DATA.

Figure 10:
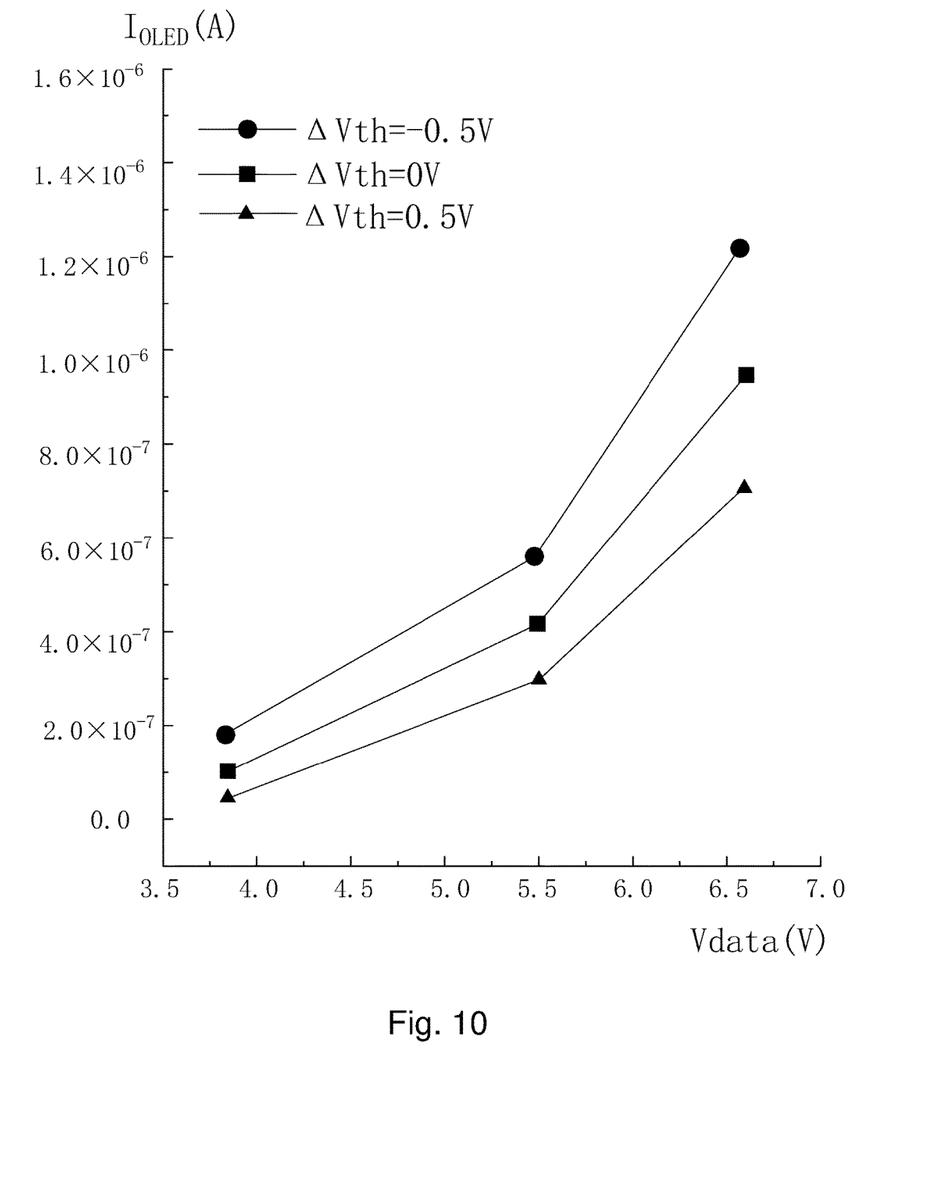
FIG. 10 is a schematic view showing analog data of the threshold voltage drifting of the driving TFT in a known 2T1C pixel driver circuit and corresponding current flowing through OLED.
Figure 11:
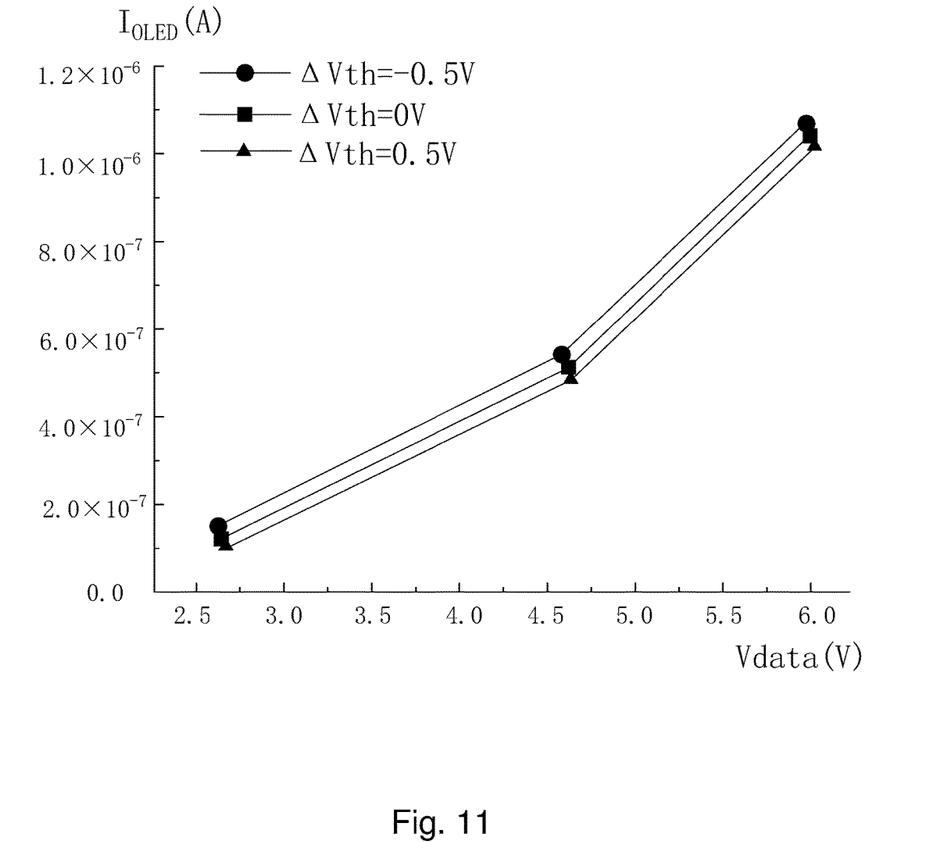
FIG. 11 is a schematic view showing analog data of the threshold voltage drifting of the driving TFT in the pixel driver circuit provided by an embodiment of the present invention and corresponding current flowing through OLED.

Referring to FIGS. 10-11, FIG. 10 is a schematic view showing analog data of the threshold voltage drifting of the driving TFT in a known 2T1C pixel driver circuit and corresponding current flowing through OLED; and FIG. 11 is a schematic view showing analog data of the threshold voltage drifting of the driving TFT in the pixel driver circuit provided by an embodiment of the present invention and corresponding current flowing through OLED, with drifting 0V, +0.5V, −0.5V. In comparison, the amount of change in the current flowing through the OLED in the present invention is obviously less than the current change in the known 2T1C structure. Therefore, the present invention effectively compensates the threshold voltage of the driving TFT to ensure the light-emitting stability and improve the luminance uniformity of the AMOLED and display quality.

In summary, the present invention provides an AMOLED pixel driver circuit and pixel driving method, by using a pixel driver circuit of 4T1C or 4T2C structure to effectively compensate threshold voltage of driving TFT in each pixel; through adding a third TFT and a fourth TFT and introducing the first scan signal to control the third TFT and the fourth TFT to respectively writing the initialization signal to initialize the gate and the source of the driving TFT in reset phase so as to reduce the complexity of the power supply signal so that the circuit can use DC power supply directly; by adding a second capacitor to regulate the influence on the source voltage of the driving TFT by the data signal voltage so as to reduce the data signal complexity. As a result, the data signal only needs to switch once.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An active matrix organic light-emitting diode (AMOLED) pixel driving method, which comprises:
   Step 1: providing an AMOLED pixel driver circuit, comprising: a first thin film transistor (TFT), a second TFT, a third TFT, a fourth TFT, a first capacitor having capacitance C1, and an organic light-emitting diode (OLED);
   the first TFT having the gate connected to a first node, the source connected to a second node and the drain connected to the positive terminal of a direct current (DC) power supply;

the second TFT having the gate connected to a second scan signal, the source connected to a data signal and the drain connected to the first node;

the third TFT having the gate connected to a first scan signal, the source connected to an initialization signal and the drain connected to the first node;

the fourth TFT having the gate connected to the first scan signal, the source connected to the initialization signal and the drain connected to the second node;

the first capacitor having one end connected to the first node and the other end connected to the second node;

the OLED having the anode connected to the second node and the cathode connected to the negative terminal of the DC power supply; and the initialization signal being a constant low level;

Step 2: entering reset phase:

the first scan signal providing high level, the second scan signal providing low level, the data signal providing a reference low level Vref, the second TFT cut off, the third TFT and the fourth TFT turned on, an initialization signal being written into the first node that is connected to the gate of the first TFT, an initialization signal being written into the second node that is connected to the source of the first TFT, and the first TFT cut off;

Step 3: entering threshold voltage detection phase:

the first scan signal transiting to low level, the second scan signal transiting to high level, and the data signal remaining the reference low level, the third TFT and the fourth TFT cut off, the second TFT turned on, the reference low level of the data signal being written into the first node that is connected to the gate of the first TFT, the second node that is connected to the source of the first TFT changed to Vref−Vth, wherein Vth is threshold voltage of the first TFT;

Step 4: entering threshold voltage compensation phase:

the first scan signal first remaining low level, the second scan signal remaining high level, the data signal transiting to a display data signal high level Vdata, the third TFT and the fourth TFT cut off, the second TFT turned on, the data signal writing the display data signal high level via the second TFT into the first node that is connected to the gate of the first TFT and the first capacitor, the second node that is connected to the source of the first TFT transiting to Vref−Vth+ΔV, wherein ΔV is influence on the source voltage of the first TFT that is connected to the second node caused by the display data signal high level voltage; and Step 5: entering light-emitting phase:

the first scan signal remaining low level, the second scan signal transiting to low level, and the data signal transiting to the reference low level, the second TFT cut off, the second, third and fourth TFTs cut off, voltage difference between the first node that is connected to the gate of the first TFT and the second node that is connected to the source of the first TFT remaining unchanged due to storage effect of the first capacitor;

the OLED emitting light and current flowing through the OLED independent of the threshold voltage of the first TFT;

wherein the first and second scan signals are set to high levels at different phases so that the high levels of the first and second scan signal are shifted away from each other and wherein in the threshold voltage compensation phase, the second scan signal maintains at high level to completely overlap the display data signal high level Vdata of the in the threshold voltage compensation phase until the second scan signal and the data signal simultaneously transit to the low level and the low reference level in the light-emitting phase.

2. The AMOLED pixel driving method as claimed in claim 1, the AMOLED pixel driver circuit provided in Step 1 further comprises a second capacitor, with one end connected to the drain of the first TFT and the positive terminal of the DC power supply, and the other end connected to the source of the first TFT and the second node.

3. The AMOLED pixel driving method as claimed in claim 1, wherein the AMOLED pixel driver circuit provided in Step 1 comprises a second capacitor having capacitance C2, and the influence ΔV on the source voltage of the first TFT that is connected to the second node caused by the display data signal high level voltage is:

$$\Delta V = (V\text{data} - V\text{ref}) \times (C1/(C1+C2+C_{OLED})),$$

wherein $C_{OLED}$ is the intrinsic capacitance of the OLED.

4. The AMOLED pixel driving method as claimed in claim 1, wherein the first TFT, the second TFT, the third TFT and the fourth TFT are all low temperature polysilicon (LTPS) TFTs, oxide semiconductor TFTs or amorphous silicon (a-Si) TFTs; the first scan signal, the second scan signal, the initialization signal and the data signal are all generated by an external timing controller.

* * * * *